United States Patent [19]
Wischermann

[11] Patent Number: 5,027,318
[45] Date of Patent: Jun. 25, 1991

[54] BIT PLACE ORIENTED DATA STORAGE SYSTEM FOR DIGITAL DATA

[75] Inventor: Gerhard Wischermann, Weiterstadt, Fed. Rep. of Germany

[73] Assignee: BTS Broadcast Television Systems GmbH, Darmstadt, Fed. Rep. of Germany

[21] Appl. No.: 406,763

[22] Filed: Sep. 13, 1989

[30] Foreign Application Priority Data

Sep. 23, 1988 [DE] Fed. Rep. of Germany ....... 3832328

[51] Int. Cl.$^5$ .......................... G11C 7/00; H04N 5/907
[52] U.S. Cl. .................................. 365/78; 365/189.12; 365/221
[58] Field of Search .................. 358/160; 365/220, 78, 365/221, 189.12, 230.03

[56] References Cited

U.S. PATENT DOCUMENTS

| | | | |
|---|---|---|---|
| 4,106,109 | 8/1978 | Fassbender | 365/221 |
| 4,599,710 | 7/1986 | Pelgrom et al. | 365/221 |
| 4,743,979 | 5/1988 | Okano et al. | 358/339 |
| 4,773,045 | 9/1988 | Ogawa | 365/220 |
| 4,777,624 | 10/1988 | Ishizawa et al. | 365/189.12 |
| 4,912,680 | 3/1990 | Masaki et al. | 365/78 |

Primary Examiner—John W. Shepperd
Attorney, Agent, or Firm—Frishauf, Holtz, Goodman & Woodward

[57] ABSTRACT

For economy in electronic componnets and their interconnections a multiplex memory system for temporary storage of digital signals, especially digital video signals, is made up of memory units each of which stores the contents of the same bit place of different data words of the data arriving at the memory system. The corresponding bits of eight words are entered in parallel in each memory. The system can be configured with memory components presently available for any desired data word bit width without waste of storage capacity. For each multiplex memory plane constituted by the memory unit for a particular bit place, only two shift registers are needed for writing into and reading out of a RAM, provided that one of the two shift registers has a built-up in D register for parallel output, a feature that is commonly available commercially. This is much more convenient and economical than the requirement of three D registers per multiplex memory plane in a conventional multiplex memory.

5 Claims, 2 Drawing Sheets

BIT PLACE ORIENTED DATA STORAGE SYSTEM FOR DIGITAL DATA

This invention concerns a data storage system for digital signals which is well adapted for intermediate short term storage of video signals such as is frequently required in the processing of digital video signals. The data signals for which the storage system of the invention is useful, whether video signals or not, consist of digital multibit data words in which each bit has a significance depending on the order of transmission when the data words are transmitted in a serial bit stream so that there are classes of bits having the same significance or place. The word "place" commotes numerical significance of a bit (binary digit) in a binary number, whereas the expression "significance class" generalizes the concept for inclusion of non-numerical data, but the word "bit place" is used in this specification for brevity to represent the broader concept.

It is necessary in the processing of digital data signals especially in the processing of digital video signals to store signals being processed in successive batches for particular intervals (a line, field or frame interval in video processing) and then, to read them out in continuous processing. Frequently the data rate of the signals to be stored is substantially higher than the maximum access speed in the memory units that are available for storing them. For that reason a multiplex technology has been resorted to for known storage systems, in which the individual memories which are written into concurrently (i.e. in mulitplex) and then read out from concurrently (i.e. demultiplexing) are referred to as multiplex "planes" of a memory system. The number of multiplex planes, which corresponds to a multiplexing factor multiplies the amount of data through-put of the memory system compared to the use of a single unitary memory. In the storing of digital video signals during processing, therefore, memory systems have become known in which the data words to be stored are successively distributed cyclically into a number of memories and are likewise sequentially read-out cyclically in corresponding order from the memories. Each of these memories thus accepts only a fraction of the data words and can therefore be clocked more slowly than incoming data word stream.

The known memory systems of the kinds just mentioned involve a considerable expense and complication of circuits, especially for distributing the digital signals to the individual memories.

SUMMARY OF THE INVENTION

It is an object of the present invention to provide a memory system for digital signals suitable for storing digital video signals, which utilizes the multiplex technology with much less expense and complication than the heretofore known multiplex memory systems and, if possible, with a minimum amount of expense.

Briefly, a multiplex memory is provided consisting of one write/read memory (RAM) for each bit place into which, by suitable means, bits of the same bit place from each of a sequence of data words are written, so that each memory stores only bits from a single bit place selected from a sequence of data words, each such sequence consisting of a number of words equal to the number of bits which each of the individual write/read memories is able to enter into storage in parallel. In reading out the bits are read out and serialized in such a way that they can be recombined into the original data words.

The memory system according to the invention has the advantage that a much smaller expense and complication of circuitry is necessary, which means that less space is needed on circuit boards and, accordingly, smaller apparatus results. In addition, the practice of the invention involves less electric power consumption.

There is a further advantage that even though the memory system of the invention makes use of standardized memory components, it can be easily configured for economical use with digital video signals having a number of bit places different from the usual number. Thus, for example the memory system of the invention can be designed for digital video signals with a bit width which is greater or less than the usual eight bits without leaving any storage capacity unused.

Finally, the bit-oriented memory system of the invention leads to more so-called transparence in the documentation and checking the data-processing and in localizing errors in the data.

In particular, individual serial to parallel converters are usefully provided for each bit place and their outputs are connected to input/output connections of the respective write/read memories for the corresponding bit places and, likewise, individual parallel to serial converters for respective bit places have their inputs connected to the input/output connections of the respective corresponding memories and provide a serial output operating at such a rate as to facilitate the interleaving the several bit place outputs to reconstitute the data words in a serial data stream. As will be presently explained, such circuits can be built with simplicity out of readily available components.

BRIEF DESCRIPTION OF THE DRAWINGS

The invention is further described by way of illustrative example with reference to the annexed drawings, in which.

The same components appearing in more than one figure are designated by the same reference numerals.

DESCRIPTION OF THE ILLUSTRATED EMBODIMENTS

Figure 1:
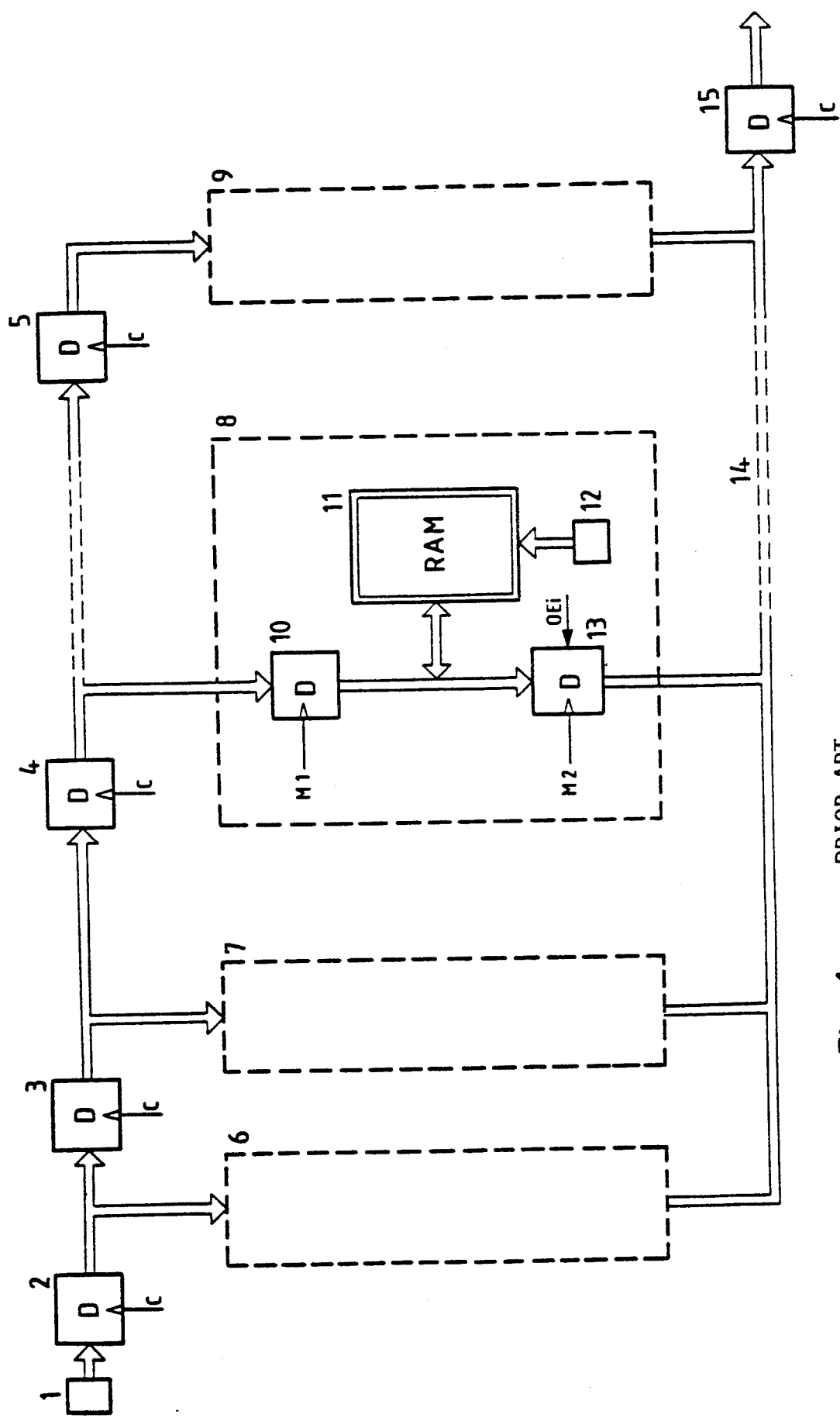
FIG. 1 is schematic representation of a well known prior art system.

In the prior art memory system shown in FIG. 1, the digital signals to be stored are supplied at an input 1 as parallel data words each having eight bit places. In this illustrated case eight D registers, each of 8-bit capacity are used to delay the signals for one period of the clock pulse frequency C which is referred to hereinafter as the system clock rate or period. In order to simplify the drawing only four D registers of the eight that are used are shown, these being the D registers 2, 3, 4 and 5. At the outputs of the actually eight D registers these appear simultaneously eight data words that were supplied sequentially to the input 1. These are then simultaneously stored respectively in eight multiplex planes (i.e. in eight individual memories operating concurrently). For reasons of simpler illustration only four multiplex planes are schematically represented in FIG. 1, namely the multiplex planes 6, 7, 8 and 9. The basic arrangement and construction of the multiplex planes will be explained with reference to the multiplex plane 8, which is shown in more detail in FIG. 1, as an example. An input register 10 serves to receive each data word into a multiplex plane. The register 10 is clocked in a rhythm M1, the frequency of which is given by the formula $f_{M1} = \frac{1}{8} * f_C$. A received data word is then stored in the write/read memory 11 (RAM) at an address that is supplied at 12. The supply of other necessary signals for operating the write/read memory 11 is in itself known and does not need to be further explained in connection with the present invention.

The write/read memories 11 of all multiplex planes are addressed in common, so that in the overall memory system represented by FIG. 1, eight successive data words are stored under a single address.

The data transfer by read-out from the write/read memories 11 is likewise performed in parallel in a rhythm M2 of which the frequency is likewise $\frac{1}{8}$ of the frequency of the system clock frequency C. The data words thus provided in the output registers 13 are then successively read-out (from right to left) by corresponding output-enabling of the output registers 13 and supplied over an output bus 14 to a D register 15 from which they can be transmitted further at the system clock frequency C.

Figure 2:
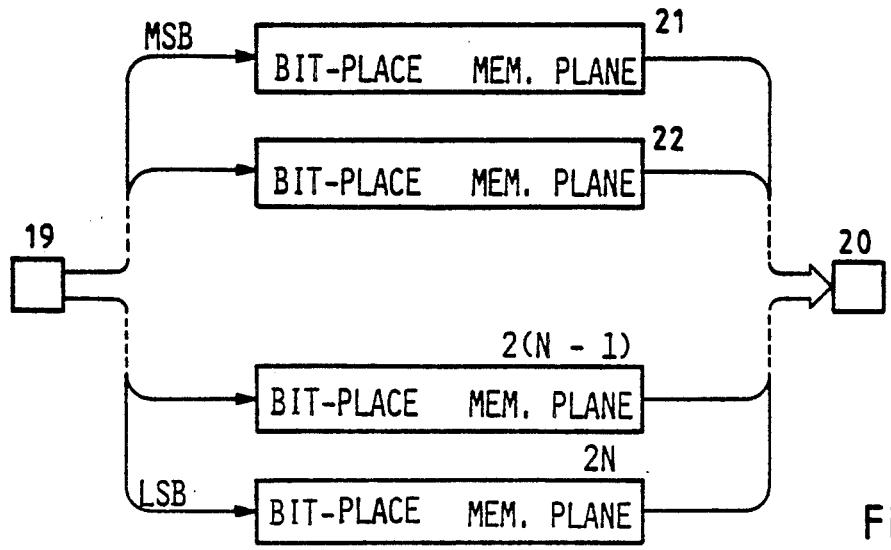
FIG. 2 is a basic diagram of a memory system according to the invention.

In the memory system of the invention shown in FIG. 2 the content of the individual bit places of the data words arriving at 19 are respectively distributed by bit place to the multiplex planes 21, 22 ... 2(n−1) and 2N are thereafter recombined to be supplied at the output 20. The number of multiplex planes is not limited in any way by the number of bit places to be processed in parallel in standardized memory units. Thus for example the multiplex planes may be provided for storing digital video signals having a width of 10 bits, without any storage capacity remaining unused. Within the individual multiplex planes 21, 22 ... 2N the respective corresponding bit place contents a number of data words are in each case processed in parallel.

Figure 3:
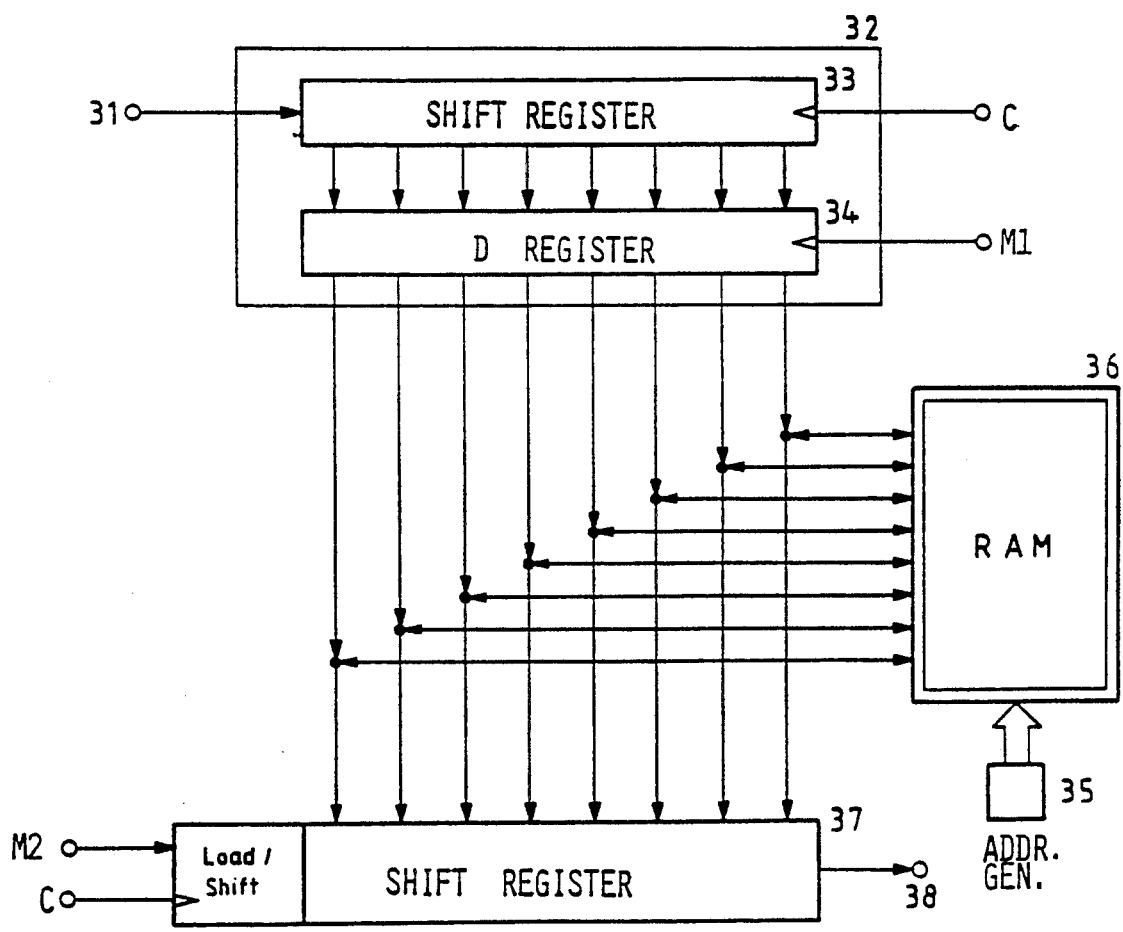
FIG. 3 is a somewhat more detailed diagram of one of the individual memories (memory planes) of the multiplex memory system of FIG. 2.

FIG. 3 shows an illustrated embodiment of a multiplex plane in a memory system according to the invention. The input signal at 31, which in every case is made up of signals of only one and the same bit place, is supplied to a serial to parallel converter 32. This converter contains an eight-place shift register 33 and an 8-place D-register 34. The shift register 33 is clocked by the system clock pulses C, and the D register 34 by the pulses of the M1 rhythm. The input signal is clocked into the shift register 33 of the system clock rate C, whereas at every pulse of the rhythm M1 the content of the shift register 33 is communicated to and stored in the D-register 34. At this time the shift register contains information from the same bit place of eight successive data words. These bits are then stored in the write/read memory 36 in an address supplied at 35.

An eight-place shift register with parallel loading inputs 37 serves as a parallel-to-serial converter for the new eight-bit data words read out of the write/read memory 36. The parallel transfer of the new data words into the shift register 37 takes place at the rhythm M2 which is supplied to the load/shift input of the shift register 37. The read-out of the shift register is in step with the system rhythm C. At the output 38 of the shift register 37, accordingly, there appears, in a serial sequence, the information of the same bit place of different data words and these can be put together with the other bit place information from the other memories in the output stage 20 shown in FIG. 2. In the illustrative example shown in FIG. 3 only two shift registers are needed per multiplex plane, and the D register 34 is already contained in an available shift register component. In the prior art circuit shown in FIG. 1, on the other hand, three eight-place D registers are needed per multiplex plane.

In the case of shift register components, however, basically fewer connections are necessary than in the case of D registers, since in shift register components the serial input or output requires one connection, whereas in D registers a number of connections corresponding to the number of bit places is necessary in each case for the input and for the output. The shift registers suitable for use in the illustrated example in accordance with the invention are available in casings with 16 connections. D registers for the prior art memory system each have 20 connections.

The ratio of the number of connections of the example of the invention compared to the example of the prior art is thus 32:60, therefore 8:15. This saving is particularly significant for the reason that for a compact mode of construction of equipment, not only reduction of the number of components is important, but also reduction of the conductors connecting the components, since the latter also require space on the circuit boards.

Although the invention has been described with reference to a particular illustrative embodiment it will be understood that variations and modifications are possible within the inventive concept.

I claim:

1. A data storage system for digital signals, especially digital video signals, which consist of digital multibit data words in which each bit has a significance (place) depending on the order of bit transmission when said data words are transmitted in a serial bit stream, whereby in a stream of transmitted data words, however transmitted, significance classes of bits (bit places) are recognizable, said system comprising:

a plurality of write/read memories each capable of entering into storage simultaneously at one address, and reading out from storage under one address, simultaneously, a predetermined plural number of bits and consisting of one said write/read memory for each bit place;

means for selecting, from an input digital data word stream, bits of each bit place from each of successive sequences of a plurality of data words and writing them into said respective memories so that each said memory stores only bits from a single bit place different from the bit places of bits stored by all others of said memories and stores bits from said single place from a single said sequence of a plurality of data words under a single memory address, said sequences of data words each consisting of a number of words equal to said predetermined number of bits which each of said memories is able to store under a single memory address, and means for concurrently reading out from all said memories the bits respectively stored therein from a said sequence of data words and for regrouping the bits so read out into reproduced data words of said input data word stream, each said reproduced word consisting of one bit from each one of said memories, to provide a corresponding output data word stream.

2. A data storage system for digital signals, especially digital video signals, which consist of digital multibit data words in which each bit has a significance (place) depending on the order of bit transmission when said data words are transmitted in a serial bit stream, whereby in a stream of transmitted data words, however transmitted, significance classes of bits (bit places) are recognizable, said system comprising:

- a plurality of write/read memories each capable of entering into storage simultaneously at one address, and reading out from storage under one address, simultaneously, a predetermined number of bits and consisting of one said write/read memory for each bit place;
- means for selecting, from an input digital data word stream, bits of each bit place from each of successive sequences of data words and writing them into said respective memories so that each said memory stores only bits from a single bit place and stores bits from said single place from a single sequence of data words under a single memory address, said sequences of data words each consisting of a number of words equal to said predetermined number of bits which each of said memories is able to store under a single memory address, said selecting and writing means comprising a plurality of serial to parallel converters (32) consisting of one serial to parallel converter for each bit place and each of said write/read memories (36) being equipped with data input/output connections which are connected to the respective outputs of a corresponding serial to parallel converter (32), and
- means for concurrently reading out from all said memories the bits respectively stored therein from a said sequence of data words and for regrouping the bits so read out into data words of said input data word stream to provide a corresponding output data word stream, said means for reading out from said memories comprising a plurality of parallel to serial converters consisting of one parallel to series converter (37) for each bit place having inputs connected to said input/output connections of a corresponding write/read memory of said plurality of write/read memories and having a serial bit output.

3. The data storage system of claim 2, wherein said read-out and regrouping means also comprise means for synchronizing the respective serial bit outputs of said parallel to series converters (37) to a memory system clock signal (6) in such a manner as to interleave cyclically in time the serial bit outputs of said respective parallel to series converters (37) and means for combining the serial bits of all said serial bit outputs into a regrouped serial data word stream.

4. A data storage system for digital signals, especially digital video signals, which consist of digital multibit data words in which each bit has a significance (place) depending on the order of bit transmission when said data words are transmitted in a serial bit stream, whereby in a stream of transmitted data words, however transmitted, significance classes of bits (bit places) are recognizable, said system comprising:

- a plurality of write/read memories each capable of entering into storage simultaneously at one address, and reading out from storage under one address, simultaneously, a predetermined number of bits and consisting of one said write/read memory for each bit place;
- means for selecting, from an input digital data word stream, bits of each bit place from each of successive sequences of eight data words and writing them into said respective memories so that each said memory stores only bits from a single bit place and stores bits from said single place from a single said sequence of eight data words under a single memory address, whereby said selecting and writing means are capable writing into said write/read memories eight bits of the same bit place respectively from eight different data words in parallel into a said memory, and
- means for concurrently reading out from all said memories the eight bits respectively stored therein from a said sequence of data words and for regrouping the bits so read out into data words of said input data word stream to provide a corresponding output data word stream.

5. The data storage system of claim 4, wherein said means for selecting bits from successive sequences of data words and writing them into said memories comprises eight of serial to parallel converters (32) consisting of one serial to parallel converter for each bit significance class (bit place) and said read write memories (36) are eight in number, each equipped with data input/output connections which are connected to the respective outputs of a corresponding serial to parallel converter (32), and said means for reading out from said memories comprises eight parallel to serial converters consisting of one parallel to series converter (37) for each bit place having inputs connected to said input/output connections of a corresponding read/write memory of said eight read/write memories and a serial bit output.

* * * * *